(12) United States Patent
Ghadaksaz

(10) Patent No.: US 7,982,477 B2
(45) Date of Patent: Jul. 19, 2011

(54) UNIVERSAL TEST FIXTURE FOR HIGH-POWER PACKAGED TRANSISTORS AND DIODES

(75) Inventor: Michael M. Ghadaksaz, Inverness, IL (US)

(73) Assignee: AES Technologies, Inc., Schaumburg, IL (US)

( * ) Notice: Subject to any disclaimer, the term of this patent is extended or adjusted under 35 U.S.C. 154(b) by 0 days.

(21) Appl. No.: 12/221,451

(22) Filed: Aug. 1, 2008

(65) Prior Publication Data

US 2011/0080188 A1    Apr. 7, 2011

(51) Int. Cl.
  *G01R 31/10*  (2006.01)
  *G01R 31/26*  (2006.01)
(52) U.S. Cl. ............ 324/750.09; 324/750.1; 324/762.01
(58) Field of Classification Search . 324/750.01–750.11, 750.14, 762.01–762.06; 361/161–165, 688–704
See application file for complete search history.

(56) References Cited

U.S. PATENT DOCUMENTS

| | | | |
|---|---|---|---|
| 5,761,036 A * | 6/1998 | Hopfer et al. ................ | 361/704 |
| 6,441,631 B1 * | 8/2002 | Kwang et al. ............ | 324/750.09 |
| 6,487,079 B2 * | 11/2002 | Katsui ........................... | 361/704 |
| 6,636,062 B2 * | 10/2003 | Gaasch et al. ........... | 324/750.09 |
| 7,097,488 B2 * | 8/2006 | Hayakawa et al. .......... | 439/331 |
| 7,286,353 B2 * | 10/2007 | Yu et al. ....................... | 361/697 |
| 7,548,422 B2 * | 6/2009 | Hsieh ............................ | 361/695 |
| 2006/0202709 A1 * | 9/2006 | Norris ........................... | 324/765 |
| 2007/0159793 A1 * | 7/2007 | Lin ................................ | 361/695 |
| 2008/0079451 A1 * | 4/2008 | Maenner ..................... | 324/755 |

* cited by examiner

*Primary Examiner* — Ha Tran T Nguyen
*Assistant Examiner* — Joshua Benitez
(74) *Attorney, Agent, or Firm* — Patents and Licensing LLC; Daniel W. Juffernbruch

(57) ABSTRACT

A universal test fixture for testing and characterization of high-power flange-packaged RF and microwave transistors and diodes includes a precision-machined heat sink having a built-in center cavity with a finger catch on either side of the cavity which uses a plurality of matching modules that are installed in the center cavity and designed as transistor or diode carrier modules to provide mounting for the high-power packaged RF and microwave devices in a wide variety of flange type packages, an adjustable clamping structure connected to a movable arm, and a plurality of non-conductive high temperature pressure clamps. Each carrier module is made of a gold-plated rectangular aluminum block having a center cavity that is machined to the package outline. A non-conductive black-anodized high-temperature resistant pressure clamp machined to the package outline holds the packaged device in the carrier module. When clamped down using the clamping structure, the pressure clamp holds the package leads on a printed circuit board ensuring excellent electrical contact between package leads and circuit traces and surrounding ground planes, obviating soldering and desoldering the leads to the circuit board. The pressure clamp also produces pressure along the device package to hold the packaged device to the carrier module which houses the device and which itself is bolted to the heat sink resulting in excellent thermal contact under the device.

16 Claims, 9 Drawing Sheets

Fig. 3A

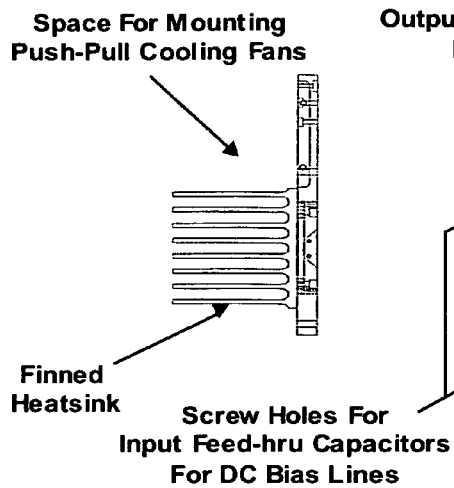

Space For Mounting Push-Pull Cooling Fans

Finned Heatsink

Screw Holes For Input Feed-hru Capacitors For DC Bias Lines

Fig. 3B

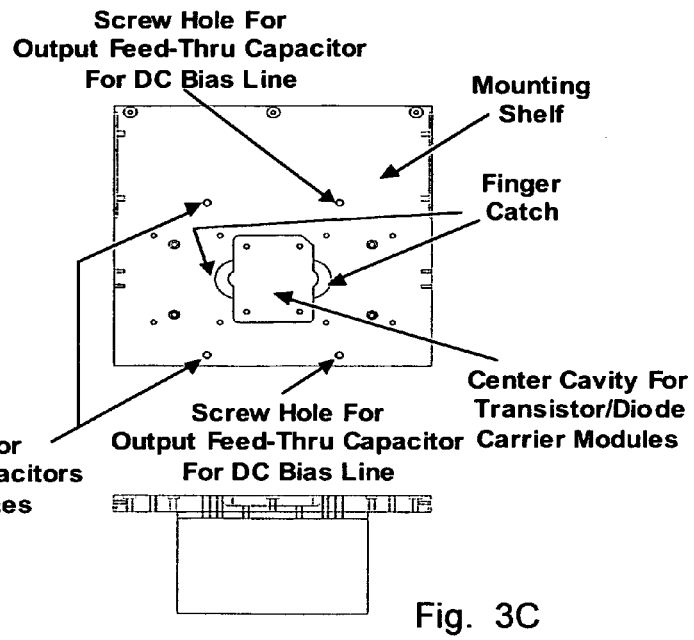

Screw Hole For Output Feed-Thru Capacitor For DC Bias Line

Mounting Shelf

Finger Catch

Center Cavity For Transistor/Diode Carrier Modules

Screw Hole For Output Feed-Thru Capacitor For DC Bias Line

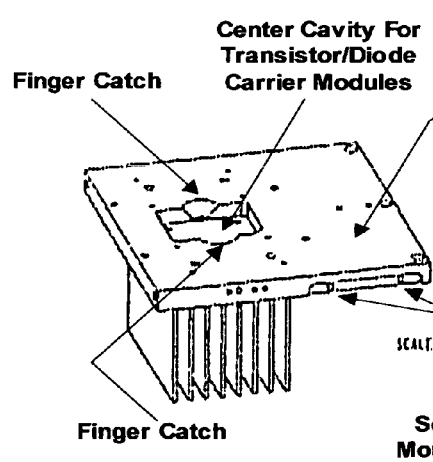

Finger Catch

Center Cavity For Transistor/Diode Carrier Modules

Finger Catch

Fig. 3E

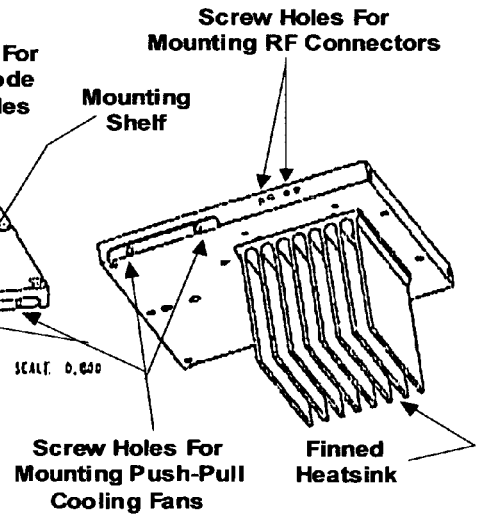

Screw Holes For Mounting RF Connectors

Mounting Shelf

Screw Holes For Mounting Push-Pull Cooling Fans

Finned Heatsink

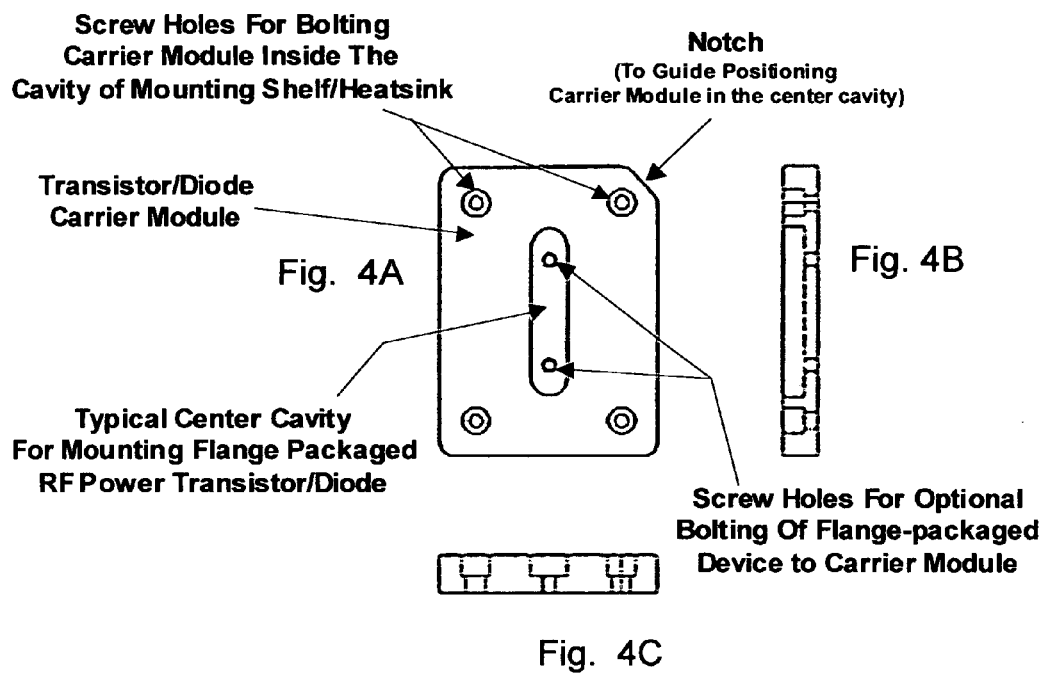

A Typical Nonconductive Pressure Clamp

Screw Holes For Optional Bolting Of Device Flange To The Carrier Module

UNIVERSAL TEST FIXTURE FOR HIGH-POWER PACKAGED TRANSISTORS AND DIODES

FIELD OF INVENTION

The present invention relates generally to the field of semiconductor testing, and more particularly relates to a test fixture for high-power packaged semiconductor devices such as transistors and diodes used, for example, in RF or microwave applications.

BACKGROUND

High-power RF and microwave transistor and diode chips are generally housed in expensive ceramic-metallic packages. These packages are typically flange type, and are available in a wide variety of styles as shown in FIG. 1. An RF power transistor die, sliced and cut from a wafer, exhibits very low impedance and is often very difficult to handle and work with when designing power amplifiers and oscillators, switches, and similar circuits. Small size, special handling, and the need for ultra clean room to work with power transistor die and impedance variations are also among some of the reasons working with power transistor die can be difficult for a power amplifier designer. To make handling safer, and designing with power transistors more friendly, RF and microwave power semiconductor manufacturers place one or more transistor die (chips) in ceramic-metallic packages (see, for example, FIG. 2), and in some cases in recent years in less expensive over-mold plastic-metallic packages. RF and microwave semiconductor manufacturers also often include miniature partial matching circuitry inside the package to step up the impedance so that the packaged device exhibits an impedance level that is much easier to work with when designing power amplifiers, oscillators, switches, and so on. RF and microwave power semiconductor manufacturers use a wide variety of package styles depending on, for example, power, frequency, and gain. High-power packaged RF and microwave transistors and diodes are commonly used in commercial cellular communications equipment, military radio systems, radar transmitters, broadcast and security systems, satellite and ground station equipment, microwave point-to-point radio systems, etc.

High-power packaged transistors and diodes generate significant amounts of heat when used in high-power amplifiers, oscillators, attenuators, and the like. For this reason, the high-power packaged transistors and diodes require adequate heat sinking to quickly remove the heat therefrom otherwise the temperature could rise above the maximum allowable junction temperature of the transistor or diode, resulting in degradation of the specified electrical performance, or even the destruction, of these expensive semiconductor components. The need for heat removal is necessary not only when such devices are incorporated into products, but also when these devices are tested and/or characterized prior to being incorporated in an intended product.

When designing or working with these high-power packaged transistors and diodes, it is often necessary to test or characterize these devices. Since these devices generate a significant amount of heat when they are operated, a test fixture is required to have the ability to transfer heat away from the devices. Thermally coupling a heat sink to the device by means of the test fixture is one way of removing the excess heat generated by the high-power packaged transistor and diodes. Conventionally, because the packaged device must be mounted on the heat sink, a center cavity is created on the top surface of the heat sink, the cavity being machined to the package outline of the specific package style of the device under test. This conventional approach results in a custom model shop test fixture. Once the custom model shop test fixture is completed, it cannot be used with devices having package styles other than the one for which it was originally designed. Therefore, with new design requirements and applications for which power devices may be available in different package styles the designer will be faced with new requirements for different test fixtures. This situation is often accompanied by long model shop lead times, expensive set up charges, the need for mechanical drawings, and so on.

What is needed is, a universal test fixture for high-power packaged transistors and diodes, to enable testing of such devices independent of their package styles and geometries.

SUMMARY OF THE INVENTION

Briefly, a universal test fixture for nondestructive testing and characterization of high-power flange-packaged RF and microwave transistors and diodes includes a precision-machined finned aluminum heat sink having a built-in center cavity with a finger catch on either side of the cavity which uses a plurality of matching modules that are installed in the center cavity and designed as transistor or diode carrier modules to provide mounting for high-power RF and Microwave transistors and diodes in a wide variety of flange types packages, an adjustable clamping structure connected to a movable arm, and a plurality of non-conductive high temperature pressure clamps. Each transistor or diode carrier module is made of a gold-plated rectangular aluminum block having a center cavity that is machined with ultra-precision to the package outline of the RF power transistor or diode. A non-conductive black-anodized high temperature resistance pressure clamp made of Teflon, also machined with ultra, precision to package outline of the RF and microwave transistor or diode holds the packaged transistor or diode in the carrier module. When clamped down using the clamping structure, the pressure clamp holds the package leads on a printed circuit board ensuring excellent electrical contact between package leads and circuit traces and surrounding ground planes, obviating soldering and desoldering the leads to the circuit board. The pressure clamp also produces pressure along the device package to hold the packaged transistor or diode to the carrier module which houses the device and which itself is bolted to the heat sink resulting in excellent thermal contact under the device and thus achieving maximum heat transfer.

BRIEF DESCRIPTION OF THE DRAWINGS

FIGS. 3A-3E show various views of the heat sink and mounting shelf of the universal test fixture of the present invention.

FIGS. 4A-4C show various views of the transistor/diode carrier module in accordance with the present invention.

DETAILED DESCRIPTION

Figure 1:
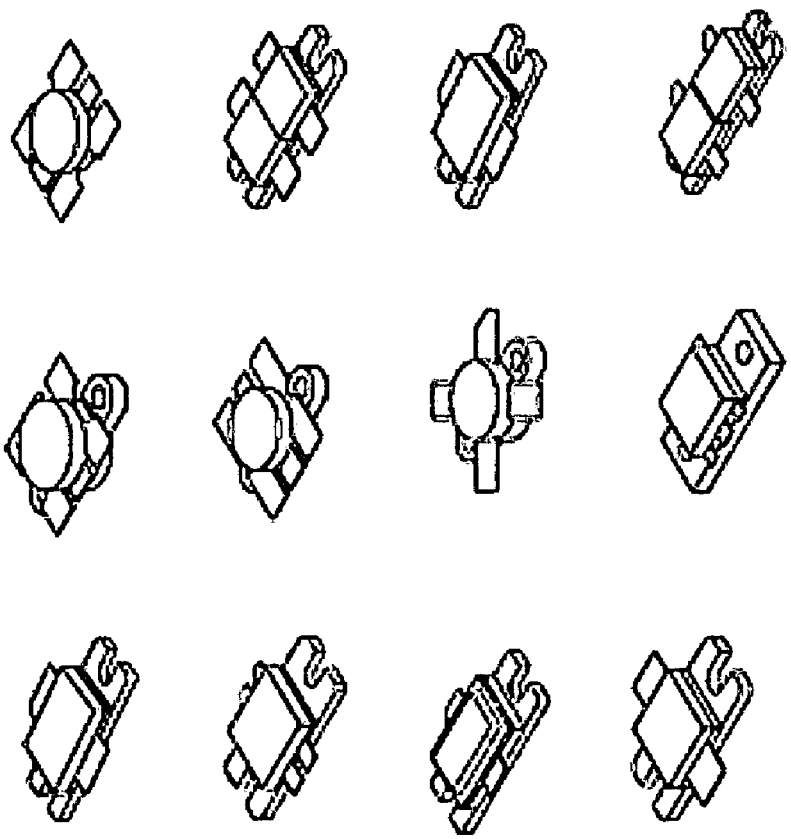
FIG. 1 illustrates a variety of known high power RF and microwave flanged single-and double-ended ceramic packages, each of which has two mounting holes.
Figure 2:
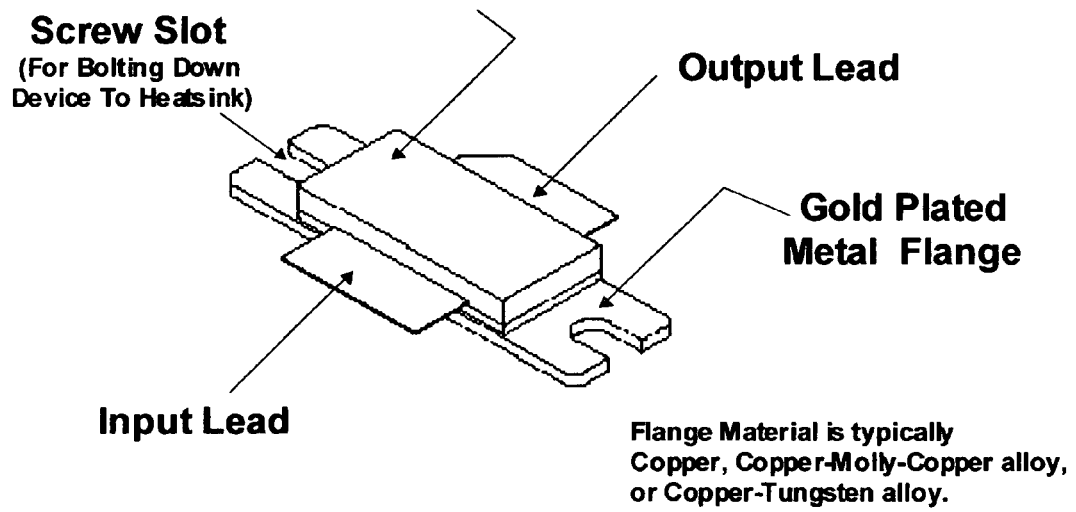
FIG. 2 is an illustration of a known ceramic-metallic flange-packaged high power RF transistor.

Generally, an apparatus in accordance with the present invention is provided that is suitable for receiving and holding, at one time, one or more high-power packaged transistors, diodes and the like; providing controlled impedance pathways between device under test and external circuitry, including but not limited to, test, evaluation, and characterization equipment; and operable to provide thermal conduction for at least heat removal purposes. The apparatus in accordance with the present invention is operable to accept a wide variety of package types, thus providing a common platform for operating a wide variety of high-power packaged semiconductor devices, including but not limited to, RF and microwave transistors and diodes, where those packages have a correspondingly wide variety of styles, shapes, geometries, and dimensions.

Characterization of RF power transistors, may include determination of beta, early voltage, emitter/base capacitance, frequency response, Ft, unity gain, and switching performance.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The acronym RF, as used herein, refers to radio frequency.

The acronym RFI, as used herein, refers to radio frequency interference.

The expression, power transistor, as used herein, refers to transistors having physical and electrical characteristics suitable for relatively high current operation. Power transistors are commonly found in the final output stage of amplifier circuits. It is noted that both bipolar and MOS processes may be used to construct power transistors. In typical applications, bipolar power transistors are used as RF power transistors, whereas MOS power transistors (sometimes referred to as power FETs), are used in lower frequency amplifier applications such as audio amplifiers and H-bridge motor controllers.

The expression, RF power transistor, as used herein, refers to power transistors that are operated at RF frequencies. RF power transistors are physically constructed so as to be able to handle high-power RF signals, in devices such as, but not limited to, radio transmitters.

The expression, test fixture, as used herein, refers generally to hardware utilized to receive a device under test (DUT), and to couple the ?D?UT to one or more external electrical components, or one or more pieces of electrical test equipment.

Teflon is the well-known DuPont trademark for a synthetic fluoropolymer, poly(tetrafluoroethylene).

As noted above, high-power packaged RF and microwave devices, such as, for example, power transistors, exhibit low impedance. These devices are used, for example, in power amplifiers where device input and output impedance must be matched to system impedance, which is normally 50 ohms, for optimum performance and safe operation over frequency, voltage, and temperature. For these reasons, an RF power transistor may be placed between two sections of microstrip circuit board mounted on a test fixture. Alternatively, and often, a slot is created at the center of the microstrip board whose geometry matches the package outline of the RF power transistor. When the microstrip board is mounted on the test fixture, the center slot on the circuit board and the center slot on the heat sink line up, if properly designed. The RF power transistor is then dropped in the slot through the microstrip circuit board and onto the heat sink slot making contact with the bottom surface of the heat sink slot. The device is then bolted to the heat sink to ensure good thermal contact between device package and the heat sink, in order to maximize the heat transfer from the device package to the heat sink.

Generally, ordinary custom model shop test fixtures are designed with poor quality and typically require that the leads of the power devices be soldered to the test board. Once the leads are soldered it will be very difficult to safely remove the device should the designer be required to test several samples during an engineering design phase, which is normally the case and therefore this method of testing can lead to destruction of these expensive power devices and the test boards. High power devices are generally very expensive, particularly in small quantities, which is often the case for prototype design or initial product development. Normally, multiple samples are tested, one at a time, on a microstrip circuit board which is mounted on the test fixture to measure device impedance and other electrical performance characteristics such as gain, output power, efficiency, stability, etc. To measure the device input and output impedance after the test circuit is fully optimized, the device must be lifted and removed from the circuit board and input and output ports are terminated with 50 ohm loads. With the device successfully removed and input and output ports terminated in 50 ohms, a properly calibrated impedance probe can be placed at points on the microstrip circuit board where device input and output leads had previously been soldered. Looking into the input matching section, the input impedance presented to the device input is measured on a network analyzer. The conjugate of this impedance represents the source impedance of the device measured over the desired frequency range. To measure the load impedance of the device, the probe is placed at the point where the output lead of the packaged device was previously soldered to the microstrip board and looking into the output impedance matching circuit, the impedance presented to the device output is measured on the network analyzer. The conjugate of this impedance represents the load impedance of the device. For these reasons it is highly desirable to be able to perform nondestructive testing of these expensive high-power packaged devices. In addition, difficulties arise when attempting to remove a device, which has already been soldered to the circuit board. Repeatedly heating the solder joints to remove the device often results in destroying the device and the circuit board. These problems cannot be avoided in conventional high-power test fixtures.

Various embodiments of the present invention overcome the problems mentioned above by bridging the gap between flange-mount packaged RF and microwave power transistors and diodes, and test environments, by providing a low-cost common test platform that allows nondestructive testing of high-power packaged transistors and diodes independent of their package styles, using nestling blocks as modular transistor and diode carriers. The common test platform can adapt to virtually any package style by inserting a matching transistor or diode carrier module in the center cavity of the test platform. It will be appreciated that the common test platform mentioned above, may also be referred to as a universal test fixture.

Various embodiments of the present invention provide a low-cost, easy to use, adaptable universal test fixture that can be configured for RF power and impedance testing of flange-packaged high power RF and microwave transistors and diodes independent of their package styles.

Some exemplary embodiments of universal test fixture for high-power packaged RF and microwave transistors and diodes in accordance with the present invention include a finned heat sink having a built-in rectangular cavity at the center of its mounting shelf, an adjustable clamping structure connected to a movable arm, nestling modules, hold-down Teflon pressure clamps, a pair of push-pull cooling fans, an AC power entry module, and two pairs of DC connectors for transistor or diode bias lines.

In one aspect of the present invention, a method is provided for creating a universal test fixture by eliminating expensive custom-crafted model shop test fixtures that are package dependent. An illustrative universal test fixture includes a finned heat sink with integrated mounting shelf spreading over the finned area and machined with ultra precision out of a single block of aluminum and anodized and having a built-in cavity of rectangular shape at the center of the mounting shelf (see FIGS. 3A-3E). The heat sink center cavity has a corner notch as a guide for proper positioning of a transistor or diode carrier module inside the cavity, and two finger-catches, one on each side of the cavity, for easy placement of transistor or diode carrier modules inside the heat sink cavity and removal from the heat sink cavity. The heat sink center cavity also has four screw holes to allow transistor or diode carrier modules to be bolted down to the heat sink.

Referring to FIGS. 4A-4C, an illustrative carrier module is shown which is made of aluminum, machined with ultra precision to the exact package outline of each flange package and nickel gold plated for durability to provide nestling for high-power RF and microwave flange-packaged transistors and diodes. In accordance with the present invention, transistor and diode carrier modules have a common rectangular shape with common outside dimensions, the only difference is that the cavity at the center of each module is carved, or otherwise formed, to match a specific package style. The transistor or diode module has a corner notch that allows it to be placed in only one position inside the heat sink center cavity. Each module also has four recessed screw holes on the surface of the module and two screw holes inside its center cavity, which match with the screw hole positions of the specific package it is designed to nestle and which allow the packaged transistor or diode to be screwed down to the carrier module if needed.

When the carrier module is placed inside the center cavity of the mounting shelf/heat sink the screw holes of the carrier module line up with the screw holes of the center cavity of the mounting shelf/heat sink. When testing a high-power packaged transistor or diode, the appropriate carrier module having a matching cavity geometry with that of the packaged transistor or diode under test is first installed in the heat sink cavity and bolted down to the heat sink for maximum heat transfer. Once bolted down inside the heat sink cavity, the module surface will be flush with the surface of the mounting shelf of the heat sink. With the transistor carrier module in place and flush with the mounting shelf of the heat sink, the test board (circuit board) having a slot corresponding to the transistor package outline is placed over the mounting shelf and screwed down to the heat sink at several places to achieve excellent ground contact. With the test board mounted on the test fixture, the slot in the test board will line up with the outline of the cavity in the transistor carrier module now sitting beneath the test board.

Figure 5:
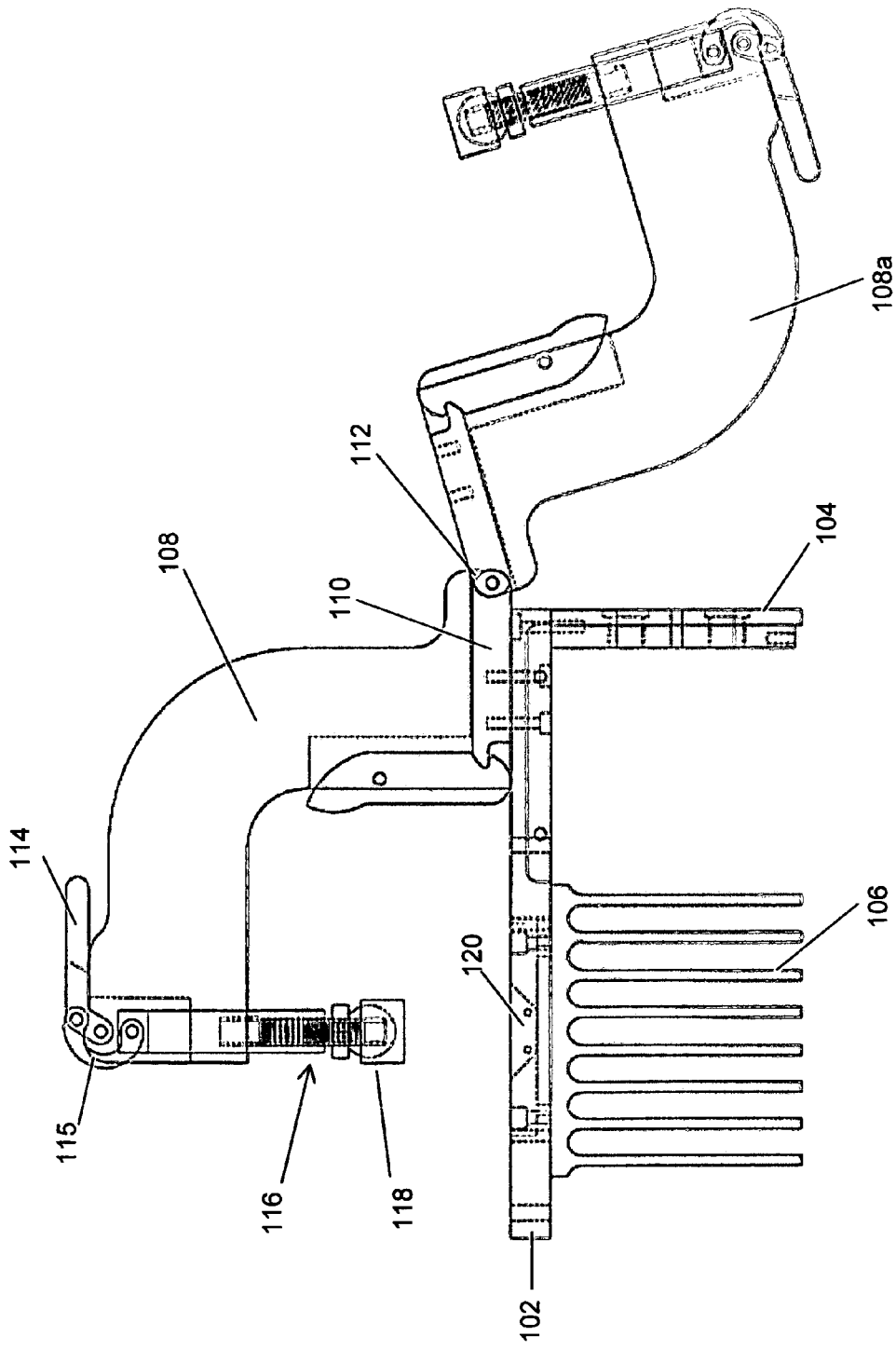
FIG. 5 is a cross-sectional view of an illustrative universal test fixture for high-power packaged RF and microwave transistors and diodes in accordance with the present invention, where the movable arm is shown in both the locked and fully released positions.

In another aspect of the present invention, a universal test fixture having an adjustable clamping structure, which is connected to a movable arm, is shown in FIG. 5. The movable arm is placed in upright locked position when testing high-power packaged transistors and diodes (e.g., RF power devices) and can be unlocked and disengaged, and placed in a horizontal position away from the mounting shelf/heat sink to clear space for the designer to conveniently make changes to and/or repair the circuit board, solder and replace components, remove or replace RF power devices, install and remove transistor/diode carrier modules. Some very expensive conventional custom crafted high power transistor test fixtures have a stationary arm to which the clamping structure is normally connected. The stationary arm interferes with end-user's design activities and makes it very inconvenient to make design changes, solder or replace components on the circuit board, and so on.

Still referring to FIG. 5, a cross-sectional view of an illustrative universal test fixture for high-power packaged RF and microwave components in accordance with the present invention is shown. More particularly, a stage 102 is provided, stage 102 having a recessed portion 120; a support structure 104 is attached to stage 102; a finned heat sink 106 is attached to the underside of stage 102; an arm 108 is attached to a base portion 110 by means of a hinge 112 at a first end of arm 108; base portion 110 is attached to stage 102; a vertically adjustable clamping bar 116 is attached to a second end of arm 108; and vertically adjustable clamping bar 116 includes a lever 114, a linkage 115, circularly adjustable compression head 118. Vertically adjustable clamping bar 116 is positioned at the second end of arm 108 such that when it is extended, shield 118 can surround an RF power transistor under test.

Still referring to FIG. 5, it can be seen that arm 108, by means of hinge 112, is rotatable about hinge 112. In this way, arm 108 may be moved out of the way (see arm 108a, which is arm 108 rotated away from stage 102) so that a packaged RF power transistor or diode, along with its corresponding transistor/diode carrier module, can be installed or removed from stage 102. In typical embodiments, stage 102 is formed from a thermally conductive material such as a metal.

Heat sink 106 serves to remove heat from an operating component, such as but not limited to, a packaged RF or microwave power transistor or diode, disposed in thermal contact (directly or indirectly) with stage 102. Any suitable thermal transfer device or subsystem may be used in place of, or in addition to, heat sink 106. For example, one or more heat pipes may be used to transfer heat away from the operating component (e.g., a packaged RF or microwave power transistor or diode).

Figure 6C:
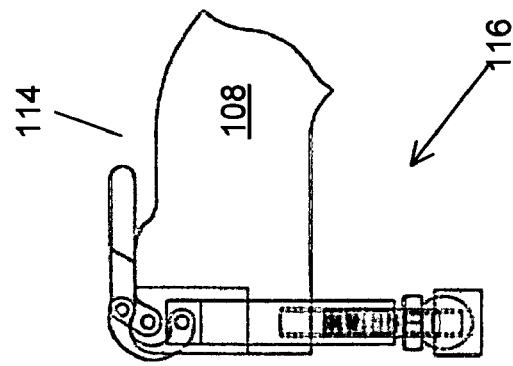
FIGS. 6A-6C show the components and arrangement of adjustable clamping structure of an illustrative universal test fixture in accordance with the present invention.
Figure 6B:
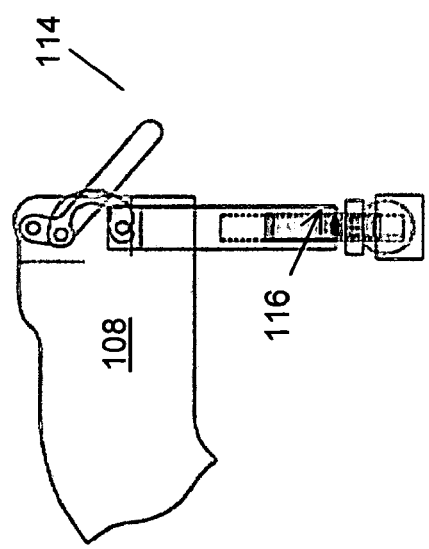
Figure 6A:
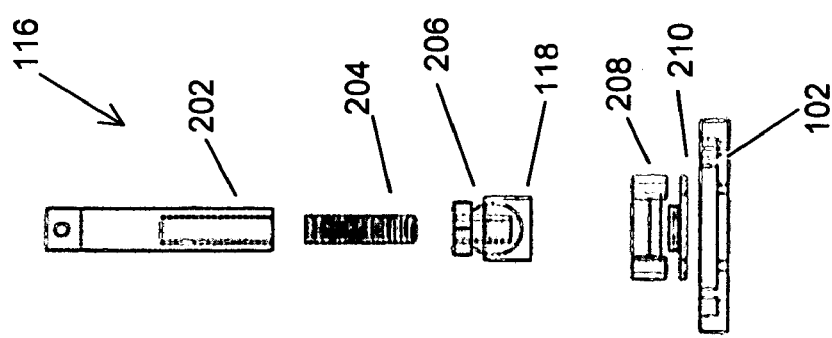

FIG. 6A is an exploded view of the adjustable clamping structure, including a shaft, a threaded steel bar, a compression head, and a circularly adjustable Teflon compression head in accordance with the present invention.

FIG. 6B is a cross-sectional view of a portion of arm 108, and attached adjustable clamping structure 116 in the extended position. A handle 114 can be rotated, e.g., 225 degrees, to exert pressure on the pressure clamp, and to lock it into position. It can be seen that first element 202 is mechanically coupled to linkage 115, and second element 204 mechanically coupled to first element 202. In the illustrative embodiment, second element 204 is threaded and can therefore be screwed into first element 202. In this illustrative embodiment, first element 202 is a shaft, and second element 204 is a threaded steel bar. In this way, the height of adjustable clamping structure 116 can be adjusted. FIG. 6C is a cross-sectional view of a portion of arm 108, and an attached adjustable clamping structure 116 in the retracted position.

Figure 7:
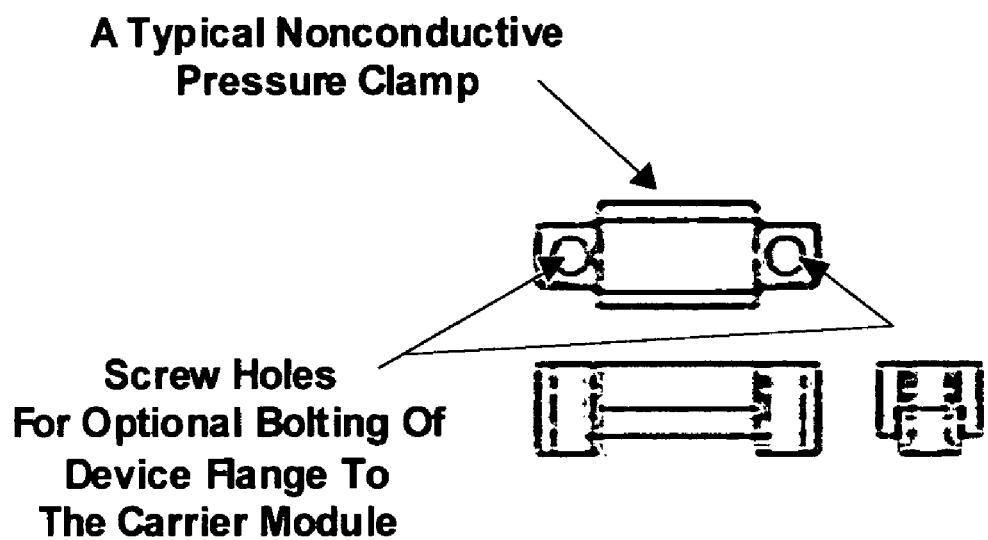
FIG. 7 shows a nonconductive pressure clamp, for a single package style, for use with the transistor/diode carrier module of an illustrative universal test fixture in accordance with the present invention.

In a still further aspect of the present invention, the universal test fixture includes a clamping structure comprising a vertically adjustable clamping bar and a circularly adjustable nonconductive compression head. As shown in FIGS. 7A-7C, the length of the clamping bar is adjusted by turning in or out the threaded bar within the shaft to achieve proper length for the clamping bar so as to achieve maximum safe pressure over the nonconductive pressure clamp once the handle is rotated 225 degrees to the locking position. The threaded bar is terminated into a circularly adjustable compression head. The head is made of Teflon, which is a high temperature plastic with excellent stiffness, low deformation under load, and high dielectric strength. The circularly adjustable feature of the compression head allows the compression head to be flexible when making contact with the nonconductive pressure clamp thus achieving excellent surface contact with the top surface of the nonconductive pressure clamp. Good surface contact between compression head and nonconductive pressure clamp results in uniform pressure over the device leads by the nonconductive pressure clamp (see FIG. 8) thus providing quality electrical connection to the circuit board without damaging the circuit board or the device leads.

Figure 8:
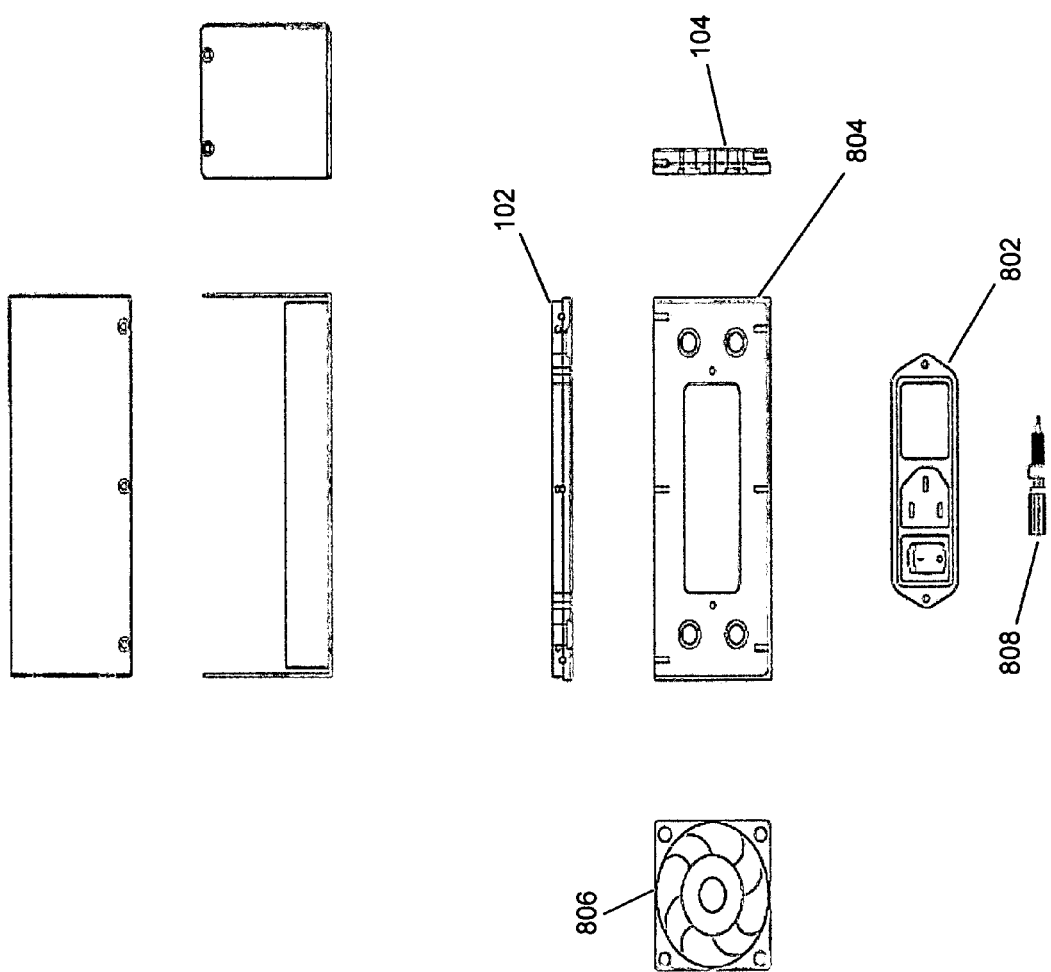
FIG. 8 is an exploded view of the back panel and assembly piece parts, including a shroud, a back panel with an opening therethrough for mounting a power entry module and threaded holes for mounting DC connectors, an AC cooling fan, a power entry module, and a DC banana connector.

FIG. 8 is an exploded view showing various components of the illustrative RF power transistor test fixture. FIG. 8 shows an AC power socket 802, and a panel 804 into which AC power socket 302 can be attached, or mounted. Panel 804 has a cut-out through which the backside of AC power socket 802 is passed. Panel 804 further includes screw holes for attaching or mounting AC power socket to panel 804. Panel 804 may, in turn, be mounted to support structure 104. Additionally, a fan 806 is shown, and fan 806 is mounted to support structure 104. Fan 806 is oriented such that it is operable to produce air flow across heat sink 106. DC Banana Connector 808 is also illustrated in the exploded view of FIG. 8.

In an alternative embodiment, fan 806 is a variable speed fan, a temperature sensor is disposed proximate the location where an RF power transistor is placed for testing, evaluation, or characterization, and the speed of the variable speed fan is adjusted based, at least in part, on the output of the temperature sensor. In this way, heat dissipation can be modulated in order to maintain a desired temperature or temperature range in which the high-power packaged transistor or diode is operated.

Figure 9:
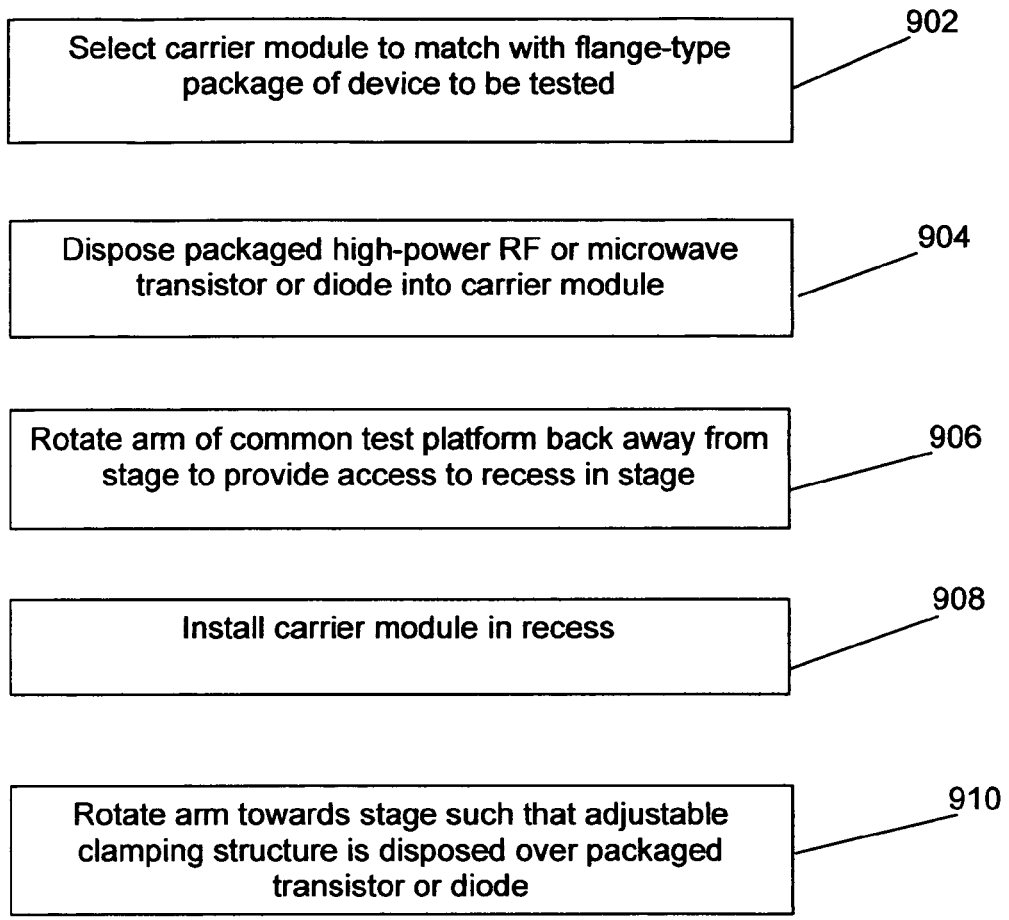
FIG. 9 is a flow diagram of an illustrative embodiment of a method in accordance with the present invention.

In an alternative embodiment of the present invention, a pair of push-pull AC fans are included, and are used to facilitate transfer of the heat dissipated through fins of the heat sink, thereby keeping the mounting shelf cool and consequently the temperature of the high-power packaged device under test resting in the carrier module well below the maximum operating junction temperature of the transistor or diode. In this illustrative alternative embodiment, each fan is installed on either side of the heat sink and right below the RF connector, as indicated in FIGS. 6 and 9. The electrical wires of the fans are connected to the back of the power entry module, which provides internal connection to the on-off switch. During RF power testing with fans turned on the fan on the input side of the fixture draws air at ambient temperature, pushes it through hot fins of the heat sink and the second fan on the output port pulls the hot air and removes it from under the heat sink. The fast push-pull air circulation results in rapid removal of heat from the heat sink thus keeping the fixture cool during RF power testing.

Various embodiments of the present invention provide an apparatus suitable for use as a text fixture for RF power devices, while managing, or alleviating, both the aforementioned problems of heat generation. In one illustrative embodiment, the apparatus includes a stage, vertical support members attached to the stage to elevate the stage above a work surface, a heat sink, mounted to, or integrated with, the underside of the stage, a rotatably hinged arm mounted, at a proximal end thereof, to the stage, a lever-operated retractable/extendable member disposed at the distal end of the arm, and a receiving recess formed in the stage.

In one embodiment, an apparatus, or test fixture, includes a stage, one or more vertical support members attached to the stage; a thermal transfer device attached to the underside of the stage; an arm, rotatably hinged, at a first end thereof, to the stage; a lever-operated, retractable shield member, disposed at a second end of the arm; and a plurality of electrically conductive pathways from a first area of the stage to a corresponding plurality of connectors mounted on the one or more vertical support members.

In another embodiment, an RF power transistor test fixture, includes a thermally conductive stage having a first surface and a second surface; a support structure attached to the second surface of the stage; a base portion attached to the stage; an arm having a first end and a second end, the first end attached by a hinge to the base portion, and the second end having a lever-operated shield mechanism attached thereto, the lever-operated shield mechanism having a retracted position and an extended position; a heat sink attached to, and extending away from, the second surface of the stage; a fan attached to the support structure, the fan operable to cause airflow across the heat sink; and a plurality of electrical conductors disposed so as to provide a corresponding plurality of electrical pathways between a first area of the stage and a plurality of connectors mounted to the support structure.

In one alternative embodiment, the lever-operated retractable/extendable shield mechanism may be automated rather than hand-operated.

Conclusion

An advantage of some embodiments of the present invention is providing a universal test fixture, or common test platform, which receives, in a recess in a stage coupled to a thermal transfer device, carrier modules having a common physical interface to the recess, and a package specific interface to a packaged device to be tested.

It is to be understood that the present invention is not limited to the embodiments described above, but encompasses any and all embodiments within the scope of the subjoined Claims and their equivalents.

What is claimed is:
1. An universal test fixture, comprising:
   a stage,
   one or more vertical support members attached to the stage;
   a thermal transfer device extending outwardly from the underside of the stage;
   an arm, rotatably hinged, at a first end thereof, to the stage;
   a lever-operated, adjustable clamping structure, disposed at a second end of the arm; and a plurality of electrically conductive pathways from a first area of the stage to a corresponding plurality of connectors mounted on the one or more vertical support members.

2. The universal test fixture of claim 1, wherein the stage includes a recess adapted to receive and electrically couple to a packaged semiconductor device.

3. The universal test fixture of claim 1, wherein the stage includes a recess adapted to receive one or more device holders.

4. The universal test fixture of claim 1, wherein the stage is adapted to couple with a carrier module, the carrier module operable to receive and hold at least one packaged semiconductor device.

5. The universal test fixture of claim 1, wherein the thermal transfer device is a finned heat sink.

6. The universal test fixture of claim 1, further comprising a fan disposed adjacent the thermal transfer device, the fan oriented to cause air flow across the thermal transfer device.

7. The universal test fixture of claim 1, wherein the adjustable clamping structure, in an extended position, provides downward force for at least holding the device under test in place.

8. The universal test fixture of claim 1, further comprising an AC power socket mounted to the one or more vertical support members.

9. The universal test fixture of claim 1, further comprising a temperature sensor coupled to the stage.

10. The universal test fixture of claim 1, wherein the stage includes a recess adapted to receive and thermally couple to a packaged semiconductor device; and further comprising at least one finger catch disposed adjacent the recess.

11. A common test platform for packaged semiconductor components, comprising:

a thermally conductive stage having a first surface and a second surface, and a recess formed within the first surface;

a support structure attached to the second surface of the stage;

a base portion attached to the stage;

an arm having a first end and a second end, the first end attached by a hinge to the base portion, and the second end having a lever-operated adjustable clamping structure attached thereto, the lever-operated adjustable clamping structure having a retracted position and an extended position;

a heat sink attached to, and extending away from, the second surface of the stage;

a fan attached to the support structure, the fan operable to cause airflow across the heat sink; and a plurality of electrical conductors disposed so as to provide a corresponding plurality of electrical pathways between a first area of the stage and a plurality of connectors mounted to the support structure.

12. The common test platform of claim 11, wherein the lever-operated adjustable clamping structure is disposed over the recess in the stage.

13. The common test platform of claim 11, further comprising an AC power socket mounted to the support structure.

14. The common test platform of claim 11, further comprising a temperature sensor coupled to the stage.

15. The common test platform of claim 11, wherein the fan is a variable speed fan, and the operating speed of the fan is based, at least in part, on an output of the temperature sensor.

16. The common test platform of claim 11, further comprising at least one carrier module, the carrier module adapted to mate with the recess in the stage, and to further mate with a flange-type package for an RF or microwave power device.

* * * * *